(12) United States Patent
Cox et al.

(10) Patent No.: US 11,060,183 B2
(45) Date of Patent: Jul. 13, 2021

(54) APPARATUSES, SYSTEMS AND METHODS FOR APPLYING PROTECTIVE COATINGS TO ELECTRONIC DEVICE ASSEMBLIES

(71) Applicant: HzO, Inc., Draper, UT (US)

(72) Inventors: Dana Cox, American Fork, UT (US); Max Sorenson, Cottonwood Heights, UT (US); James Kent Naylor, Kaysville, UT (US)

(*) Notice: Subject to any disclaimer, the term of this patent is extended or adjusted under 35 U.S.C. 154(b) by 0 days.

(21) Appl. No.: 13/849,790

(22) Filed: Mar. 25, 2013

(65) Prior Publication Data
US 2013/0251889 A1    Sep. 26, 2013

Related U.S. Application Data

(60) Provisional application No. 61/615,172, filed on Mar. 23, 2012.

(51) Int. Cl.
*C23C 16/02*    (2006.01)
*B05D 1/00*    (2006.01)
(Continued)

(52) U.S. Cl.
CPC ............ *C23C 16/02* (2013.01); *B05D 1/60* (2013.01); *H01L 21/6715* (2013.01); *H01L 21/6776* (2013.01)

(58) Field of Classification Search
CPC .................................................. C23C 16/568
See application file for complete search history.

(56) References Cited

U.S. PATENT DOCUMENTS 4,335,698 A * 6/1982 Stephens ............. 123/537
5,271,953 A   12/1993 Litteral
(Continued)

FOREIGN PATENT DOCUMENTS

CN    101916037 A    12/2010
CN    102083550 A    6/2011
(Continued)

OTHER PUBLICATIONS

United States Patent and Trademark Office Acting as the International Searching Authority, "International Search Report and Written Opinion," dated Mar. 19, 2013, in related international application No. PCT/US2013/020683.
(Continued)

*Primary Examiner* — Charlee J. C. Bennett
(74) *Attorney, Agent, or Firm* — Intellectual Strategies

(57) ABSTRACT

A coating apparatus may be configured to concurrently receive and waterproof a large number of electronic device assemblies. The coating apparatus may include a track for transporting the electronic device assemblies into an application station. The application station may have a cubic shape, and include an entry door and an opposite exit door. The entry and exit doors may enable the introduction of substrates into the application station, as well as their removal from the application station. In addition, the entry and exit doors may enable isolation of the application station from an exterior environment and, thus, provide control over the conditions under which a moisture resistant material is applied to the substrates. Methods for making electronic devices and other substrates resistant to moisture are also disclosed.

21 Claims, 1 Drawing Sheet

(51) Int. Cl.
*H01L 21/677* (2006.01)
*H01L 21/67* (2006.01)

(56) References Cited

U.S. PATENT DOCUMENTS

| | | | |
|---|---|---|---|
| 5,429,682 | A | 7/1995 | Harlow, Jr. et al. |
| 5,536,282 | A | 7/1996 | Yoon et al. |
| 5,536,317 | A * | 7/1996 | Crain ................ C08G 61/025 118/664 |
| 5,762,205 | A | 6/1998 | Davitz |
| 6,127,038 | A | 10/2000 | McCullough et al. |
| 6,183,615 | B1 * | 2/2001 | Yasar ................ H01L 21/67709 204/192.12 |
| 6,231,673 | B1 | 5/2001 | Maeda |
| 6,245,151 | B1 * | 6/2001 | Bhandari ............ C23C 16/448 118/726 |
| 6,389,690 | B1 | 5/2002 | McCullough et al. |
| 6,485,616 | B1 | 11/2002 | Howard et al. |
| 6,571,968 | B1 | 6/2003 | Cullen |
| 6,621,157 | B1 | 9/2003 | Wirz et al. |
| 6,641,702 | B2 * | 11/2003 | Shi et al. ................. 204/192.12 |
| 6,667,099 | B1 | 12/2003 | Greiner et al. |
| 6,919,530 | B2 * | 7/2005 | Borgeson ........... B23K 26/0838 219/121.68 |
| 7,239,227 | B1 | 7/2007 | Gupta et al. |
| 8,797,756 | B2 | 8/2014 | Sporon-Fiedler et al. |
| 2002/0102865 | A1 * | 8/2002 | Elger ............................ 438/800 |
| 2002/0124394 | A1 | 9/2002 | Slechta et al. |
| 2003/0198734 | A1 | 10/2003 | Mann |
| 2004/0228982 | A1 | 11/2004 | Kawaura |
| 2005/0008848 | A1 | 1/2005 | Saccomanno et al. |
| 2006/0001700 | A1 | 1/2006 | Bertelsen et al. |
| 2006/0087294 | A1 * | 4/2006 | Kataoka ................ F01K 23/103 323/201 |
| 2006/0213441 | A1 | 9/2006 | Kobrin et al. |
| 2007/0087131 | A1 | 4/2007 | Hutchinson et al. |
| 2007/0108161 | A1 | 5/2007 | Murugesh et al. |
| 2007/0212884 | A1 | 9/2007 | Yamamoto et al. |
| 2007/0231241 | A1 * | 10/2007 | Suzuki ................ C23C 16/4402 423/417 |
| 2007/0277790 | A1 * | 12/2007 | Bushnell ................ F02M 31/18 123/556 |
| 2009/0263581 | A1 | 10/2009 | Martin, III et al. |
| 2009/0263641 | A1 * | 10/2009 | Martin, III ............. H05K 3/284 428/221 |
| 2009/0304549 | A1 | 12/2009 | Coulson |
| 2010/0098862 | A1 | 4/2010 | Xu et al. |
| 2010/0118503 | A1 | 5/2010 | Kellermann |
| 2010/0162954 | A1 | 7/2010 | Lei et al. |
| 2010/0203347 | A1 | 8/2010 | Coulson |
| 2010/0293812 | A1 | 11/2010 | Coulson |
| 2010/0297786 | A1 | 11/2010 | Terashima et al. |
| 2010/0316800 | A1 | 12/2010 | Chang et al. |
| 2011/0143021 | A1 | 6/2011 | Peterson et al. |
| 2011/0253429 | A1 | 10/2011 | Humphries et al. |
| 2011/0262740 | A1 | 10/2011 | Martin, III et al. |
| 2011/0267674 | A1 * | 11/2011 | Wang et al. ................. 359/273 |
| 2011/0293832 | A1 * | 12/2011 | Gersdorff ................ B05D 1/60 427/255.28 |
| 2012/0273439 | A1 | 11/2012 | Beavers et al. |
| 2012/0296032 | A1 | 11/2012 | Legein et al. |
| 2014/0357782 | A1 | 12/2014 | Gautam et al. |

FOREIGN PATENT DOCUMENTS

| | | |
|---|---|---|
| CN | 102150480 A | 8/2011 |
| EP | 2 187 718 A1 | 5/2010 |
| GB | 2353639 A | 2/2001 |
| JP | H06-102374 | 4/1994 |
| JP | H07-211178 | 8/1995 |
| JP | H09-307243 | 11/1997 |
| JP | 10-093228 | 4/1998 |
| JP | H10-93228 | 4/1998 |
| JP | 2000252275 A * | 9/2000 |
| JP | 2001249002 | 9/2001 |
| JP | 2002-514004 A | 5/2002 |
| JP | 2009517852 A | 4/2009 |
| KR | 10-2011-0107345 | 9/2011 |
| TW | 201014483 A | 4/2010 |
| WO | 93/16812 A1 | 9/1993 |
| WO | WO-1994/00868 A1 | 1/1994 |
| WO | 99/57330 A1 | 11/1999 |
| WO | 2007/138302 A1 | 12/2007 |
| WO | WO-2009/151492 A2 | 12/2009 |
| WO | 2010/075462 A2 | 7/2010 |
| WO | 2010/078264 A2 | 7/2010 |
| WO | WO-2010/078264 A2 | 7/2010 |
| WO | 2010/121190 A1 | 10/2010 |
| WO | 2011/089009 A1 | 7/2011 |

OTHER PUBLICATIONS

United States Patent and Trademark Office, As the International Searching Authority, "International Search Report and Written Opinion," dated Jun. 10, 2013, in related PCT application No. PCT/US2013/033698.

United States Patent and Trademark Office acting as the International Searching Authority, "International Search Report and Written Opinion," dated Dec. 2, 2013, in related PCT application No. PCT/US2013/046371.

European Patent Office, "Supplementary European Search Report," dated Jan. 29, 2015 in European patent application No. 13735656.4.

Korean Intellectual Property Office, "Notice of Preliminary Rejection," dated Nov. 28, 2014 in Korean patent application No. 10-2012-64868.

Chinese State Intellectual Property Office, "Notification of First Office Action and Search Report," dated Mar. 23, 2015 in Chinese patent application No. 201210158907.1.

Office Action for Japanese Patent Application No. 2012-096417, dated Jun. 23, 2014.

Office Action for Japanese Patent Application No. 2015-015258, dated Aug. 28, 2015.

Office Action for U.S. Appl. No. 13/920,804, dated Jul. 2, 2020, 13 pages.

Office Action for U.S. Appl. No. 13/920,804, dated Nov. 17, 2020, 15 pages.

* cited by examiner

APPARATUSES, SYSTEMS AND METHODS FOR APPLYING PROTECTIVE COATINGS TO ELECTRONIC DEVICE ASSEMBLIES

CROSS-REFERENCE TO RELATED APPLICATION

A claim for priority under 35 U.S.C. § 119(e) to U.S. Provisional Patent Application No. 61/615,172, filed on Mar. 23, 2013 and titled "APPARATUSES FOR WATER-PROOFING ELECTRONIC DEVICE ASSEMBLIES AND METHODS" ("the '172 Provisional Application"). The entire disclosure of the '172 Provisional Applications is, by this reference, incorporated herein.

TECHNICAL FIELD

This disclosure relates generally to apparatuses for forming protective coatings and, more specifically, to coating apparatuses that are configured to be placed along assembly lines. This disclosure also relates to coating apparatuses that are configured for applying protective coatings (e.g., moisture resistant coatings, etc.) to electronic device subassemblies and components before the entire electronic device is assembled and for incorporation into electronic device assembly systems, as well as to systems and methods for protecting electronic devices (e.g., making electronic devices moisture resistant, etc.).

SUMMARY

Apparatuses, systems and methods for protecting electronic devices and other substrates are disclosed, including, various embodiments of apparatuses, systems and methods for making electronic devices and other substrates resistant to moisture.

As used herein, the term "protective coating" includes moisture resistant coatings or films, as well as other coatings or films that protect various parts of an electronic assembly from external influences. The term "moisture resistant" refers to the ability of a coating to prevent exposure of a coated element or feature to moisture. A moisture resistant coating may resist wetting or penetration by one or more types of moisture, or it may be impermeable or substantially impermeable to one or more types of moisture. A moisture resistant coating may repel one or more types of moisture. In some embodiments, a moisture resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.), wetness, etc.). Use of the term "moisture resistant" to modify the term "coating" should not be considered to limit the scope of materials from which the coating protects one or more components of an electronic device. The term "moisture resistant" may also refer to the ability of a coating to restrict permeation of or repel organic liquids or vapors (e.g., organic solvents, other organic materials in liquid or vapor form, etc.), as well as a variety of other substances or conditions that might pose a threat to an electronic device or its components. Various aspects relating to the use of masks in the application of protective coatings are disclosed.

In one aspect, an apparatus that has been configured to apply protective coatings to electronic devices as part of their assembly, which may be referred to herein as a "coating apparatus," is configured to concurrently receive and apply protective coatings to a large number of electronic device assemblies or subassemblies (e.g., partially assembled electronic devices, etc.), or to be a so-called "high throughput" apparatus. In some embodiments, a coating apparatus may be configured to concurrently receive and apply protective coatings to hundreds of (e.g., up to about a thousand (1,000), etc.) or even thousands of electronic device assemblies.

A coating apparatus may be configured for incorporation into an assembly line. In some embodiments, the configuration of a coating apparatus may enable it to occupy a place in an assembly line without intruding a significant distance into or otherwise blocking an aisle adjacent to either side of the assembly line. In some specific embodiments, a coating apparatus may have a width of no more than about two or three meters.

The width of a coating apparatus may be defined, at least in part, by its frame. Among other things, the frame of a coating apparatus may carry a track. The track may be configured to carry a rack, which may, in turn, be configured to carry a plurality of substrates (e.g., electronic device assemblies, etc.). In some embodiments, a rack may include a plurality of shelves, each of which may be configured to hold a plurality of substrates. The track may be configured to transport the rack and, thus, the substrates, along a length of the coating apparatus. Specifically, the track may be configured to transport the rack into and out of an application station, in which the electronic assemblies are at least partially covered with a protective coating. In some embodiments, the application station may comprise a deposition chamber and, for the sake of simplicity, may be referred to as such hereinafter.

The application station may include at least one door that provides access to the deposition chamber. The application station may be configured to enable each door to close in a manner that seals the deposition chamber from the environment outside of the application station. In some embodiments, the application station may include an entry door on one side of the deposition chamber, through which track may transport a rack into the deposition chamber. On an opposite side of the deposition chamber, the application station may include an exit door, through which the rack may exit the deposition chamber along the track. In some embodiments, the application station may be configured to rotate a rack present within the deposition chamber.

In addition to an application station and its deposition chamber, a coating apparatus may include pre-treatment station, which may be configured to prepare the substrate for application of a protective coating. In a specific embodiment, a pre-treatment station may include a de-gas chamber. A de-gas chamber may be configured to remove volatile compounds from a substrate before a coating of protective material is applied to the substrate. In embodiments where the coating apparatus also includes a track, the track may transport a rack, along with electronic device assemblies thereon, into and through the pre-treatment station (e.g., the de-gas chamber, etc.). In some embodiments, the pre-treatment station may include one or more doors, which may be configured to seal an interior of the pre-treatment station from the environment outside of the pre-treatment station. In other embodiments of this type, the pre-treatment station may lack doors, which may reduce the need for cleaning, maintenance and/or repairs.

Optionally, a coating apparatus may include one or more pumps and/or valves to provide control over pressure in one or more other components of the coating apparatus (e.g., the application station, the pre-treatment station, etc.).

Of course, a coating apparatus also includes a supply system of one or more components that supply a protective material (e.g., a moisture resistant material, etc.) to the deposition chamber. Where the width of the coating apparatus enables it to be incorporated into an assembly line, the supply system may be positioned and/or oriented in a manner that minimizes the overall width of the coating apparatus. For example, and not by way of limitation, the supply system may be positioned at a higher elevation than, or even above, the pre-treatment station, if any, and the application station. Of course, the supply system may be located elsewhere on the coating apparatus.

In a specific embodiment of supply system, which should not in any way be considered to limit the scope of this disclosure or of any of the appended claims, the protective material comprises a polymer (e.g., poly(p-xylylene), or parylene, etc.). Such a material may, in some embodiments, be supplied to the deposition chamber by introducing a precursor material (e.g., [2.2]paracyclophane or an analog thereof, which is also referred to in the art as a "parylene dimer," etc.) into a vaporization chamber. Once the precursor material has been vaporized, it may flow into a pyrolysis chamber, where reactive species (e.g., p-xylylene, etc.) monomers, etc.) may be formed from the precursor material. The pyrolysis chamber may, in turn, communicate the reactive species to the deposition chamber.

In embodiments where the pressure in one or more components of the coating apparatus 10 may be controlled and/or in embodiments where a pressure within the application station 20 is controlled (e.g., held constant, maintained at pressure below ambient pressure (e.g., atmospheric pressure, etc.), maintained at a vacuum, etc.), the supply system may include a valving system. In some embodiments, a valving system may control the flow of material through the supply system. In embodiments where the supply system includes a vaporization chamber and a pyrolysis chamber, the valving system may include a first shutoff valve between the vaporization chamber and the pyrolysis chamber, as well as a second shutoff valve between the pyrolysis chamber and the deposition chamber. The shutoff valves may be controlled in such a way that conditions (e.g., temperature, pressure, etc.) within the pyrolysis chamber may be constantly maintained while operation of one or both of the vaporization chamber and the deposition chamber are temporarily interrupted. For example, closure of the first shutoff valve may maintain conditions within the pyrolysis chamber while the vaporization chamber is accessed (e.g., to introduce additional precursor material therein, etc.). As another example, closure of the second shutoff valve may maintain conditions within the pyrolysis chamber while the deposition chamber is opened to enable the introduction of electronic device assemblies therein or the removal of electronic device assemblies therefrom.

In addition to the shutoff valves, the valving system of a coating apparatus may include one or more control valves. A control valve may be positioned between the pyrolysis chamber and the deposition chamber. Alternatively, or in addition, a flow control valve may be positioned between the vaporization chamber and the pyrolysis chamber. The flow control valve(s) may control the rate(s) at which material flows through the coating apparatus. For example, one or more control valves may provide control over the rate at which precursor material is vaporized, the rate at which vaporized precursor material flows from the vaporization chamber into the pyrolysis chamber and the rate at which reactive species flow from the pyrolysis chamber into the deposition chamber.

Although the disclosure emphasizes embodiments of a coating apparatus that are configured to deposit a moisture resistant protective coating simultaneously onto a plurality of substrates that comprise electronic device assemblies, various teachings of this disclosure are also applicable to coating apparatus that employ different techniques, that apply other types of protective coatings and/or that are configured for use in conjunction with a variety of other types of substrates.

Methods for making electronic device assemblies resistant to moisture are also disclosed.

Other aspects of the inventive subject matter of this disclosure, as well as features and advantages of various aspects of that subject matter, will become apparent to those of ordinary skill in the art through consideration of the ensuing description, the accompanying drawings, and the appended claims.

DETAILED DESCRIPTION

Figure 1:
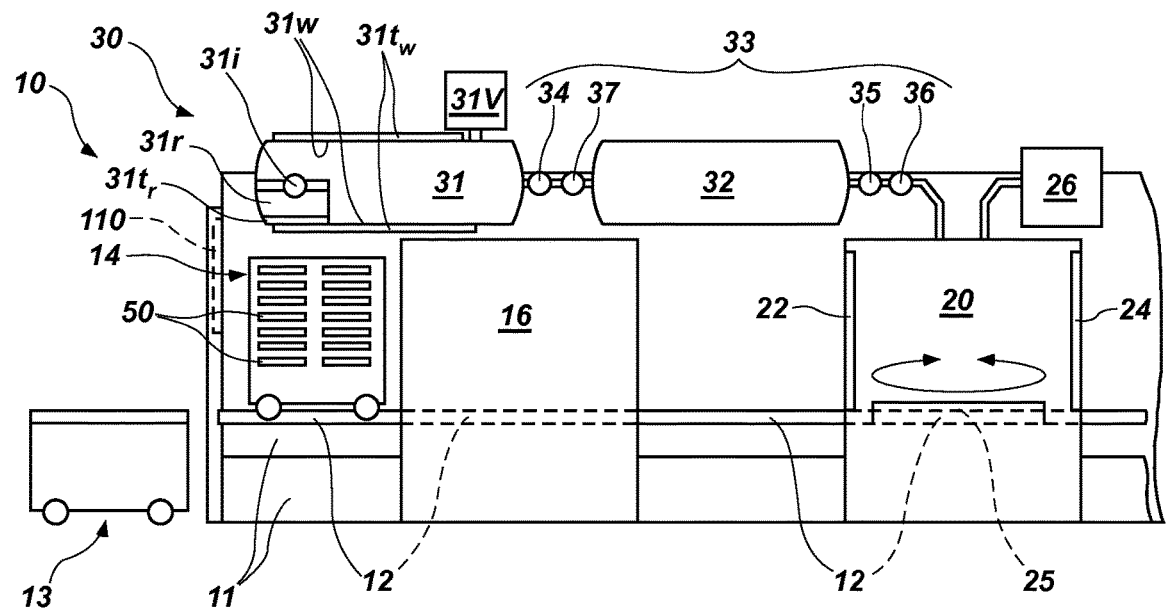
FIGS. 1 and 2 are schematic representations of an embodiment of coating apparatus.
Figure 2:
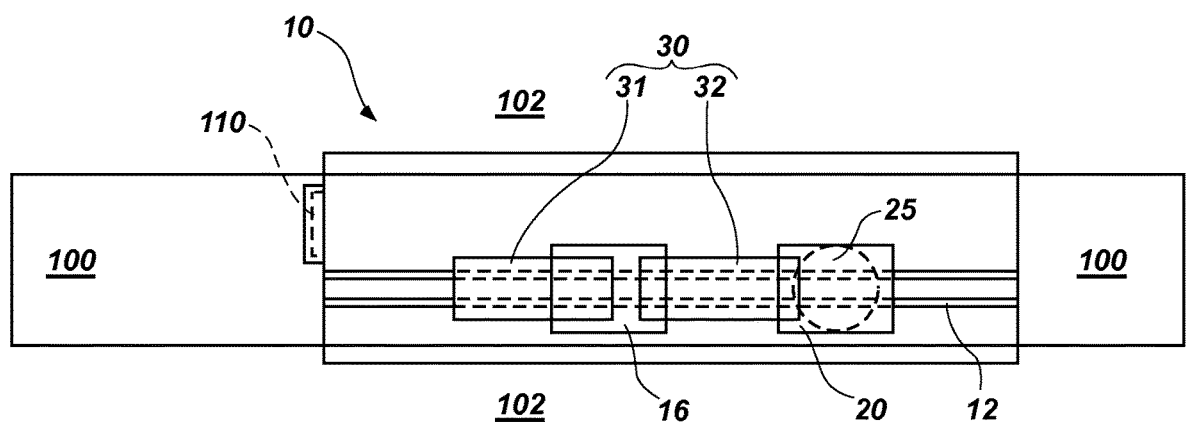

FIGS. 1 and 2 illustrate an embodiment of a coating apparatus 10. The coating apparatus 10 is configured to apply a protective coating onto a substrate 50. In various embodiments, the coating apparatus 10 may comprise a so-called "high throughput" apparatus, in which a per-substrate coating time may be a matter of seconds (e.g., thirty seconds or less, twenty seconds or less, ten seconds or less, etc.). The coating apparatus 10 may be configured to concurrently apply waterproof coatings to a plurality of substrates 50. In some embodiments, hundreds of substrates 50 (e.g., up to about a thousand (1,000) substrates, thousands of substrates, etc.) may be simultaneously coated. A number of factors may determine the number of substrates that may be simultaneously coated, including, without limitation, the size(s) of the substrates, the technique by which coating is applied to the substrates and the volume of the location where coating occurs, among other factors. In such embodiments, the per-substrate coating time may refer to the quotient of the duration of time needed to complete a cycle divided by the number of substrates coated during that cycle.

Without limiting the scope of the disclosed subject matter, a coating apparatus 10 may be configured to form waterproof coatings on electronic device components during their assembly. This type of substrates 50 may also be referred to herein as an electronic device assembly.

In some embodiments, a coating apparatus 10 may include a frame 11 for carrying its other components. The coating apparatus 10, including its frame 11, may be configured for incorporation into an assembly line 100. In some embodiments, the coating apparatus 10 may be configured to fit into the assembly line without protruding a significant distance into aisles 102 on either side of the assembly line 100. Such an embodiment may be configured for incorporation into an assembly line 100 without blocking or otherwise impeding movement along either or both of the aisles 102 that are adjacent to the assembly line 100. As will become more apparent hereinafter, the positioning and orientation of various components of the coating apparatus 10 may impart it with the ability to be readily incorporated into an assembly line 10.

A coating apparatus 10 may include a track 12 for transporting one or more substrates 50 along or through the coating apparatus 10. More specifically, the track 12 may be configured to transport a complementarily configured rack 14, which, in turn, is configured to carry one or more substrates 50 through the coating apparatus 10. In the illustrated embodiment, the track 12 is oriented along the length of the frame 11 of the coating apparatus 10. The track 12 may be continuous, or it may include a number of discrete sections. In the embodiment illustrated by FIGS. 1 and 2, the track 12 may be configured in such a way that it may simultaneously carry a plurality of racks 14, which may be located at different elements, or stations, of the coating apparatus 10. An elevation of the track 12 may gradually and slightly decrease from an input location where it receives a rack 14 to an output location from which a rack 14 is removed from the coating apparatus 10. Such a gradual decrease in elevation may enable gravity to facilitate the movement of each rack 14 along all or selected parts of the track 12 and, thus, through the coating apparatus 10.

A separate cart 13 may carry a rack 14 to the track 12. To enable movement of the rack 14 from the cart 13 to the track 12, the track 12 may be positioned (e.g., at a location, at an elevation, etc.) that enables the cart 13 to be brought into a position adjacent to the track 12 and to readily receive the rack 14 from the cart 13. When used in combination, the cart 13, the track 12 and the rack 14 may enable movement of substrates 50 throughout an assembly facility, thereby enabling the coating apparatus 10 to be used as part of an assembly line 100 or separately from the assembly line 100.

Some embodiments of a coating apparatus 10 may include a pre-treatment station 16. The pre-treatment station 16 may be configured to prepare each substrate 50 and, optionally, the rack 14, for further processing. The size of the pre-treatment station 16 may correspond to a desired throughput for the coating apparatus 10 (e.g., the pre-treatment station 16 may include a chamber having a volume of about 1 m$^3$, etc.). Without limitation, the pre-treatment station may comprise a de-gas chamber, which may be configured to facilitate the release of and to capture any volatile compositions or other potential contaminants that may be present on a substrate 50 (e.g., flux from an electronic device assembly, etc.) before a protective coating is applied to that substrate 50. In embodiments where the coating apparatus 10 also includes a track 12, the track 12 may pass through the interior of the pre-treatment station 16 and the interior of the pre-treatment station 16 may be configured to accommodate the rack 14. In some embodiments, the pre-treatment station 16 may be configured to operate while its interior remains exposed to the environment in which the coating apparatus 10 is located. Stated another way, the pre-treatment station 16 may lack doors.

Following any pre-treatment, a substrate 50 may be immediately introduced into an application station 20 of the coating apparatus 10. Alternatively, the substrate 50 may be temporarily held (e.g., for two hours or less, for one hour or less, for thirty (30) minutes or less, etc.) between removing the substrate 50 from the pre-treatment station 16 (e.g., a de-gas chamber, etc.) and introduction of the substrate 50 into the application station 20.

Regardless of whether or not a coating apparatus includes a pre-treatment station 16, once each substrate 50 is ready to be waterproofed, it may be introduced into the application station 20 of the coating apparatus 10. In embodiments where the coating apparatus 10 includes a track 12, the application station 20 may be positioned along the track 12, or the track 12 may be configured transport a rack 14 into and out of the application station 20.

A configuration of the application station 20 may correspond to the process or processes by which a coating is to be applied to each substrate 50. In some embodiments, for example, where the protective coating that is to be applied to one or more substrates 50 comprises a polymer (e.g., poly(p-xylylene), or parylene; another material that may be formed in manner similar to parylene; any material that is deposited (e.g., by chemical vapor deposition (CVD) processes, atomic layer deposition (ALD) processes, etc.); etc.), the application station 20 may comprise a deposition chamber. A portion of the application station that receives one or more substrates 50 for coating may be configured (e.g., have a volume, etc.) to provide a desired throughput (e.g., a parylene deposition chamber having a volume of about 1 m$^3$ may accommodate a rack 14 that carries electronic device assemblies for several hundred (e.g., five hundred, seven hundred, nine hundred, a thousand, etc.) smart phones; etc., with the rack 14, the substrates 50 and any other components that are introduced into the application station 50 consuming as much as 20%, 25%, 50% or more of the volume within the application station 50).

Each substrate 50 may be isolated from the environment external to the application station 20 or external to the coating apparatus 10 while applying a protective coating to one or more substrates 50 (e.g., to prevent contamination of the surfaces of each substrate 50; to prevent contamination of the coating; to provide a vacuum, such as in a CVD process, an ALD process, etc.; etc.). An entry door 22 at one side of the application station 20 may provide access to its interior (e.g., a deposition chamber within the interior of the application station 20, etc.). In some embodiments, such as the illustrated embodiment, the application station may also include an exit door 24 at an opposite side of the application station 20 may facilitate the removal of the one or more substrates 50 from within the interior of the application station 20. Each door 22, 24 of an application station 20, when placed in a closed position over its corresponding opening in the application station 20, may (optionally, along with one or more other sealing features of the application station 20) be configured to seal against adjacent portions of the application station 20 and, thus, to seal the interior of the application station 20 from the environment external to the application station 20. In some embodiments, the application station 20 and its interior may be cube-shaped, and any door(s) 22, 24 may be substantially flat or planar when in a closed position over its corresponding opening in the application station 20.

An application station 20 may include a rotatable platen 25 within its interior. A rotatable platen 25 may be configured to rotate a substrate 50 or a rack 14 carrying one or more substrates 50 while the substrate 50 and/or rack 14 resides within the interior of the application station 20 (e.g., as a protective coating is deposited onto or otherwise applied to each substrate 50, etc.). The rotatable platen 25 may enhance the uniformity with which a protective coating forms on each substrate 50.

Features that are exposed to the interior of the application station 20, such as interior surfaces of the application station 20 and its door(s) 22, 24, and surfaces of the track 12, the rack 14 and a rotatable platen 25, if present, may substantially lack indentations and other features that may cause protective material to collect as it is deposited, and which may complicate the removal of protective material. In some embodiments, the surfaces of such features may be substantially smooth (e.g., polished, glass-like, etc.), which may facilitate the removal of protective material therefrom (e.g., by simple peeling, etc.).

In embodiments where the coating apparatus 10 includes a pre-treatment station 16 and the application station 20, the application station 20 may be spaced apart from the pre-treatment station 16. In embodiments where an entry door 22 of the application station 20 faces, opposes, an exit of a pre-treatment station 16, such a spaced apart arrangement may provide for accessibility to the entry door 22 in the event that such access is desired or needed (e.g., for cleaning, during maintenance, for repairs, etc.).

With the substrate(s) 50 in the application station 20 and, if appropriate (e.g., in at least some embodiments where the application station 20 comprises a deposition chamber, etc.), each door 22, 24 of the application station 20 may be closed. A protective material may then be directed from a supply system 30 into the application station 20. The supply system 30 may, in some embodiments, be located at a higher elevation than, or even at least partially over, the track 14, the pre-processing station 16, if any, and/or the application station 20. Such an arrangement may minimize the width of the coating apparatus 10. Of course, the supply system 30 and its components may be located elsewhere on the coating apparatus 10.

In embodiments where the moisture resistant material is deposited and/or polymerizes (e.g., where the moisture resistant material comprises poly(p-xylylene), etc.), the supply system 30 may include a vaporization chamber 31 and a pyrolysis chamber 32. In addition, the supply system 30 may include a valving system 33. A vacuum source 26 (e.g., a vacuum pump, etc.) may be associated with the application station 20 to draw reactive species toward the substrate(s) 50 or to otherwise aid in the regulation of material flow, deposition and/or polymerization.

The vaporization chamber 31 may be configured to vaporize a precursor material, as known in the art. In some embodiments, one or more vacuum sources 31v (e.g., vacuum pumps, etc.) may be associated with and dedicated for use with the vaporization chamber 31. A vacuum source 31v may be used to regulate the pressure at one or more locations within the vaporization chamber 31; for example, to prevent pressure within the vaporization chamber 31 from exceeding safe limits while the vaporization chamber 31 is closed. The vacuum source 31v may also be used to control pressure downstream from vaporization chamber 31 (e.g., in the pyrolysis chamber 32, in the application station 20, etc.). In some embodiments, the vaporization chamber 31 may include an isolation feature 31i, such as a valve, that enables introduction of a precursor material into one portion of the vaporization chamber 31 (e.g., the receptacle 31r, etc.) while maintaining the pressure and/or temperature in the remainder (e.g., a majority, etc.) of the vaporization chamber 31.

A vaporization chamber 31 may be configured in such a way that different portions of the vaporization chamber 31 may be heated to different temperatures. As an example, a receptacle 31r of the vaporization chamber 31, which may facilitate the introduction of one or more precursor materials into the supply system 30, may be configured to be heated to a vaporization temperature. In some embodiments, a receptacle 31r of the vaporization chamber 31 may be configured to be selectively cooled (e.g., to selectively slow or stop vaporization of precursor material(s), etc.). A temperature control element $31t_r$, such as a heating element, a cooling element, or a combination thereof, may be configured to selectively heat and/or cool the receptacle 31r of the vaporization chamber 31. One or more walls 31w, or one or more interior surfaces, of the vaporization chamber 31 may be heated to a different temperature than the receptacle 31r (e.g., a higher temperature, etc., which may prevent material within the vaporization chamber 31 from collecting on interior surfaces of the vaporization chamber 31). Accordingly, another temperature control element $31t_w$.

Optionally, a vaporization chamber 31 may have a configuration that causes one or more precursor materials to vaporize in preparation for pyrolysis. As a specific, but non-limiting example, a vaporization chamber 31 may include one or more baffles, which may distribute the precursor material(s) evenly and, thus, enable the precursor material(s) to be introduced into the pyrolysis chamber 32 at a constant rate.

The pyrolysis chamber 32 may be associated with the vaporization chamber 31 in a manner that enables the vaporized precursor material(s) to flow from the vaporization chamber 31 into the pyrolysis chamber 32. The pyrolysis chamber 32 may be configured to convert the vaporized precursor material(s) into reactive species, which may ultimately be deposited onto a substrate 50 and polymerize to form a protective coating on the substrate 50.

The valving system 33 may include a first stop valve 34 between the vaporization chamber 31 and the pyrolysis chamber 32. A second stop valve 35 may be positioned between the pyrolysis chamber 32 and the application station 20. The valving system 33 may also include one or more control valves 36, 37, or "throttling valves," which may be used to control the rate at which materials flow into, through or out of one or more elements of the supply system 30. In the illustrated embodiment, a first control valve 36 is located between the pyrolysis chamber 32 and the application station 20. In addition, or even alternatively, a second control valve 37 may be located further upstream, between the vaporization chamber 31 and the pyrolysis chamber 32. Because of the similar locations of stop valve 34 and control valve 36 and of stop valve 35 and control valve 37, a single valve at each general position may be configured to provide both stopping and controlling functions.

In use, one or more precursor materials may be introduced into the vaporization chamber 31. As the precursor material(s) is (are) introduced, the temperature within the vaporization chamber 31 may drop and its pressure may vary. Similar changes in the conditions of the pyrolysis chamber may be avoided by closing the first stop valve 34 while the vaporization chamber 31 is exposed to the environment outside of the coating apparatus 10. The first stop valve 34 may be reopened once the vaporization chamber 31 is closed, or after conditions (e.g., temperature, pressure, etc.) within the vaporization chamber 31 have returned to operationally acceptable levels.

During operation, the conditions within the vaporization chamber 31 vaporize the precursor material(s). The vaporized precursor material(s) flow(s) into the pyrolysis chamber 32, where conditions may convert the vaporized precursor material(s) into reactive species. In embodiments where a waterproof coating of a poly(p-xylylene) is to be deposited, the reactive species may comprise p-xylylene species.

With each door 22, 24 of the application station 20 closed, the reactive species may flow or be drawn into the application station 20. Prior to opening at least one door 22, 24 of the application station 20, the second stop valve 35 may be closed to enable adjustment of the pressure within the application station 20 (e.g., from a pressure below ambient pressure to ambient pressure, from a pressure below atmospheric pressure to ambient pressure or atmospheric pressure, to an above-ambient pressure, etc.), which may prevent the introduction of contaminants onto each substrate 50 when a door 22, 24 is opened. Closing the second stop valve 35 when at least one door 22, 24 of the application station 20 is open may also isolate the pyrolysis chamber 32 from external variables and, thus, enable maintenance of conditions (e.g., temperature, pressure, etc.) within the pyrolysis chamber 32, and may prevent reactive species within the pyrolysis chamber from reacting before they exit the pyrolysis chamber. Depending on the synchronization of acts performed by the coating apparatus 10 (e.g., when a precursor material is introduced into the vaporization chamber 31 at the same time the pressure in the application station 20 is varied, while the application station 20 is open, or at the same time a substrate 50 is introduced into or removed from the application station 20, etc.), the first stop valve 34 and the second stop valve 35 may be closed at the same time, completely isolating the pyrolysis chamber 32 from external conditions.

Once a substrate 50 or group of substrates 50 has been introduced into the application station 20, each door 22, 24 may be closed and, while the second shutoff valve 35 remain closed, the pressure within the application station 20 may be reduced (e.g., by way of the vacuum source 26, etc.). Once the pressure within the application station 20 is the same as or within an acceptable level of the pressure within the pyrolysis chamber 32, the second stop valve 35 may be opened, reactive species (i.e., the pyrolyzed material) may be permitted to flow into the application station 20 to deposit onto the substrate(s) 50 and to polymerize (e.g., on the substrate(s) 50, prior to being deposited on the substrate(s) 50, etc.).

The pressure within various components of the supply system 30 and the rates at which material flows through and out of the supply system 30 may be controlled, at least in part, with one or more control valves 36, 37. The control valve 36 between the pyrolysis chamber 32 and the application station 20 may control the rate at which the reactive species flow into the application station 20. Similar control may be achieved with the control valve 37 between the vaporization chamber 31 and the pyrolysis chamber 32. In addition, the control valve 37 may enable regulation of the flow of vaporized precursor material from the vaporization chamber 31 to the pyrolysis chamber 32, independently from the flow of reactive species from the pyrolysis chamber 32 into the application station 20.

Initially, the pressure within the pyrolysis chamber 32 may be at or near its desired operational pressure (i.e., valves 34 and 35 may have been closed at or following the end of the previous deposition cycle). By closing all of the valves 34, 35, 36, 37, the pressure within the vaporization chamber 31 and, optionally, the pressure within the pyrolysis chamber 32 may be reduced (e.g., a vacuum may be generated, etc.) to a base pressure. Of course, in order to achieve the desired base pressure within the application station 20 (within which one or more substrates 50 may reside as pressure therein is reduced), each door 22, 24 of the application station 20 may be sealed in its closed position. Once the base pressure has been obtained, one or more valves 34, 35, 36, 37 may be opened (e.g., the valve 35 between the pyrolysis chamber 32 and the application station 20, etc.) to enable the pressure within the application station 20 (e.g., a deposition chamber within the application station 20, etc.) to start ramping to a base pressure (e.g., 5.5 mTorr, etc.). This process may be referred to as a "pump-down" of the coating apparatus 10. The pressure within the application station 20 may be reduced indirectly through the pyrolysis chamber 32 and/or the vaporization chamber 31, directly by way of a vacuum source 26 associated with the application station 20, or through a combination of indirect and direct means.

While an initial pump-down of the coating apparatus 10 may be accomplished with one or more vacuum sources (e.g., one or more vacuum sources associated with the vaporization chamber 31 and/or pyrolysis chamber 32, the vacuum source 26 associated with the application station 20, etc.), subsequent adjustments in pressure within the application station 20 (e.g., adjustments during the process of applying a protective coating to one or more substrates 50 within the application station 20, etc.) may be accomplished by opening all of the valves 34, 35, 36, 37 and controlling the temperature(s) within the vaporization chamber 31. Increases in temperature within the vaporization chamber 31 correspond to increases in pressure within the application station 20.

During a specific embodiment of a process for depositing a poly(p-xylylene) protective coating onto one or more substrates, a temperature within the vaporization chamber 31 and the temperature of any surface against which precursor material(s) is (are) placed may be ramped up to a desired temperature, which may be an upper vaporization temperature limit (e.g., about 170° C., etc.), a temperature that provides a desired pressure within the application station 20 (e.g., a pressure of about 9 mTorr to about 20 mTorr, etc.), an operational temperature for the vaporization chamber 131 (e.g., about 130° C. to about 140° C., etc.). Interior surfaces of walls of the vaporization chamber 31 may be heated to a greater temperature than the temperature within the vaporization temperature or the temperature to which precursor material(s) is (are) initially heated (e.g., about 10° C. greater; about 180° C., about 140° C. to about 150° C., etc.). In some embodiments, including those where all of the valves 34, 35, 36, 37 are open following an initial pressure pump-down, the temperatures within the vaporization chamber 31 and of the interior surfaces of the walls of the vaporization chamber 31 may be adjusted until the desired pressures and temperatures are achieved throughout the various components of the coating apparatus 10. This process of ramping-up the temperature(s) of the vaporization chamber 31 may take about 20 minutes to about 30 minutes.

During operation, the temperature of the pyrolysis chamber 32 may be heated to a temperature sufficient to generate reactive species from the material(s) the pyrolysis chamber 32 receives from the vaporization chamber 31. In embodiments where the precursor material includes one or more poly(p-xylylene) precursors, the pyrolysis chamber may be heated to a temperature of about 650° C. to about 690° C. (e.g., about 675° C., etc.).

One or more precursor materials may be introduced into the vaporization chamber 31 prior to one or both of the pressure pump-down and the temperature ramp-up. Alternatively, precursor material(s) may be introduced into the vaporization chamber 31 once the vaporization chamber 31 has been heated to a desired operational temperature.

In embodiments where the vaporization chamber 31 is heated to a temperature of about 130° C. to about 140° C. with a slightly higher wall temperature, the pyrolysis chamber 32 may be heated to a temperature of about 650° C. to about 690° C. (e.g., about 675° C., etc.) and the pressure within the application station 20 may be about 9 mTorr to about 20 mTorr. Under such conditions, it takes about eighty (80) minutes to deposit a poly(p-xylylene) film with a thickness of about five (5) microns onto each substrate 50.

In addition to the foregoing, a coating apparatus 10 may include one or more processing elements 110 (e.g., computers, etc.), which may automate and control the operation and synchronization of various components of the coating apparatus 10. As a non-limiting example, a processing element 110 may be programmed to provide a so-called "feedback loop"; i.e., to receive data from one or more sensors, then control operation of one of more components of the coating apparatus 10 based on the data received from the sensors. As another example, the processing element 110 may be programmed in a manner that communicates with a facility control system or facility automation system and, thus, enables integration of the coating apparatus 10 into a larger processing system (e.g., an assembly system, etc.).

Although the foregoing description contains many specifics, these should not be construed as limiting the scope of the invention or of any of the appended claims, but merely as providing information pertinent to some specific embodiments that may fall within the scopes of the invention and the appended claims. Features from different embodiments may be employed in combination. In addition, other embodiments of the invention may also be devised which lie within the scopes of the invention and the appended claims. The scope of the invention is, therefore, indicated and limited only by the appended claims and their legal equivalents. All additions, deletions and modifications to the invention, as disclosed herein, that fall within the meaning and scopes of the claims are to be embraced by the claims.

What is claimed:

1. An apparatus for applying a moisture resistant coating to a plurality of at least partially assembled electronic devices, comprising:
    a frame having a length and a width configured to fit along an assembly line for assembling components of electronic devices without blocking aisles adjacent to each side of the assembly line;
    a pre-treatment station comprising a de-gas chamber;
    a vaporization chamber comprising an isolatable material receptacle within the vaporization chamber with an isolation valve between the material receptacle and a remainder of the vaporization chamber, the material receptacle for receiving precursor material, wherein the precursor material is a dimer of a paracyclophane in a solid state, wherein the isolation valve is configured to maintain pressure and temperature in a remainder of the vaporization chamber while precursor material is introduced into the material receptacle, wherein the remainder of the vaporization chamber comprises a majority volume of the vaporization chamber and the isolatable material receptacle comprises a minority volume of the vaporization chamber, wherein the vaporization chamber further comprises one or more baffles configured to distribute the precursor material evenly as it is vaporized;
    a first temperature control element associated with the material receptacle of the vaporization chamber;
    a second temperature control element associated with an interior surface of the vaporization chamber;
    a pyrolysis chamber;
    a stop valve between the pyrolysis chamber and the vaporization chamber and a control valve between the stop valve and the pyrolysis chamber, wherein the control valve is a throttling valve;
    an application station comprising a deposition chamber configured to deposit a moisture resistant coating comprising a parylene coating, the application station configured to receive the plurality of at least partially assembled electronic devices and to apply the moisture resistant coating to the plurality of at least partially assembled electronic devices simultaneously, the application station including an entry door and an exit door on an opposite side of the application station from the entry door, wherein the vaporization chamber and the pyrolysis chamber are positioned at a higher elevation than the pre-treatment station and the application station;
    a first vacuum pump coupled to the application station and a second vacuum pump associated with and dedicated for use with the vaporization chamber;
    a second stop valve between the pyrolysis chamber and the application station and a second control valve between the second stop valve and the application station, wherein the second control valve is a throttling valve, wherein the valves are configured to enable uninterrupted operation of the pyrolysis chamber while at least one of the entry door and the exit door of the application station is open;
    a track carried by the frame and oriented along the length of the frame and positioned to pass through the interior of the pre-treatment station and through the interior of the application station through the entry door and the exit door;
    at least one rack configured to hold and transport a plurality of at least partially assembled electronic devices along the track into and through the pre-treatment station while the at least partially assembled electronic devices are disposed on the at least one rack, from the pre-treatment station and into and through the application station while the at least partially assembled electronic devices are disposed on the at least one rack and from the application station;
    a processing element programmed to receive data from one or more sensors within the apparatus and further programmed to control operation of one or more components of the apparatus based on the data received; and
    a cart for carrying the at least one rack.

2. The apparatus of claim 1, wherein the vaporization chamber comprises more than one baffle configured to distribute the precursor material evenly.

3. The apparatus of claim 2, wherein each rack of the plurality of racks includes a plurality of spaced apart layers, each layer of the plurality configured to receive a plurality of at least partially assembled electronic devices.

4. The apparatus of claim 1, wherein the application station includes a rotating platen for rotating a pallet and a plurality of at least partially assembled electronic devices carried by the pallet as a moisture resistant coating is deposited onto the plurality of at least partially assembled electronic devices.

5. The apparatus of claim 1, wherein the pyrolysis chamber is in selective communication with the vaporization chamber and the application station.

6. The apparatus of claim 5, wherein the pyrolysis chamber is positioned over the application station.

7. The apparatus of claim 5, further comprising:
    a valving system associated with at least one of the pyrolysis chamber and the application station.

8. The apparatus of claim 7, wherein the valving system includes:
    a valve for at least partially controlling a flow of material to the application station.

9. The apparatus of claim 7, wherein the valving system is configured to enable continuous operation of at least one of the vaporization chamber and the pyrolysis chamber.

10. The apparatus of claim 9, wherein the valving system is configured to enable uninterrupted operation of the pyrolysis chamber while at least one of the entry door and the exit door of the application station is open.

11. The apparatus of claim 9, wherein the valving system is configured to maintain a temperature of the pyrolysis chamber while the vaporization chamber is open.

12. The apparatus of claim 7, wherein the valving system includes at least one of:
   a valve between the vaporization chamber and the pyrolysis chamber for isolating the vaporization chamber from the pyrolysis chamber; and
   a valve between the pyrolysis chamber and the application station for isolating the pyrolysis chamber from the application station.

13. The apparatus of claim 12, wherein the valving system further includes:
   a valve positioned to at least partially control a flow of material into the application station.

14. The apparatus of claim 1, wherein the pre-treatment station and the application station are spaced apart from one another.

15. An apparatus for applying a protective coating to a plurality of at least partially assembled electronic devices, comprising:
   a frame having a width configured to fit along an assembly line for assembling components of electronic devices without blocking aisles adjacent to each side of the assembly line;
   a supply system including:
      a vaporization chamber comprising an isolatable receptacle within the vaporization chamber with an isolation valve between the receptacle and a remainder of the vaporization chamber, the receptacle for receiving at least one precursor material, wherein the at least one precursor material is a dimer of a paracyclophane in a solid state, wherein the isolation valve is configured to maintain pressure and temperature in a remainder of the vaporization chamber while precursor material is introduced into the receptacle, wherein the remainder of the vaporization chamber comprises a majority volume of the vaporization chamber and the isolatable material receptacle comprises a minority volume of the vaporization chamber, wherein the vaporization chamber further comprises one or more baffles configured to distribute the precursor material evenly as it is vaporized;
      a first temperature control element for controlling a temperature of the receptacle and a temperature of the at least one precursor material held by the receptacle;
      a pyrolysis chamber for receiving the at least one precursor material from the receptacle;
      a stop valve between the pyrolysis chamber and the vaporization chamber and a control valve between the stop valve and the pyrolysis chamber, wherein the control valve is a throttling valve; and
      a second temperature control element for controlling a temperate of at least one interior surface of the vaporization chamber;
   an application station configured to hold a rack of the plurality of electronic subassemblies, to receive material from the supply system, and to simultaneously apply a protective coating onto the plurality of electronic subassemblies, wherein the coating comprises a parylene coating wherein the vaporization chamber and the pyrolysis chamber are positioned at a higher elevation than the application station, the application station including an entry door and an exit door;
   a first vacuum pump coupled to the application station and a second vacuum pump associated with and dedicated for use with the vaporization chamber;
   a second stop valve between the pyrolysis chamber and the application station and a second control valve between the second stop valve and the application station, wherein the second control valve is a throttling valve, wherein the valves are configured to enable uninterrupted operation of the pyrolysis chamber while at least one of the entry door and the exit door of the application station is open;
   a track carried by the frame and positioned to pass through the interior of the application station through the entry door and the exit door;
   a processing element programmed to receive data from one or more sensors within the apparatus and further programmed to control operation of one or more components of the apparatus based on the data received; and
   the rack configured to hold and transport the plurality of at least partially assembled electronic devices along the track into and through the application station while the plurality of at least partially assembled electronic devices are disposed on the rack and from the application station.

16. The apparatus of claim 5, further comprising:
   a valving system associated with at least one of the pyrolysis chamber and the application station for at least partially controlling a flow of material to the application station.

17. An apparatus for applying a protective coating to a plurality of at least partially assembled electronic devices, comprising:
   a frame having a width configured to fit along an assembly line for assembling components of electronic devices without blocking aisles adjacent to each side of the assembly line;
   a supply system comprising a vaporization chamber including an isolatable receptacle within the vaporization chamber with an isolation valve between the receptacle and a remainder of the vaporization chamber, the receptacle for receiving at least one precursor material, wherein the precursor material is a dimer of a paracyclophane in a solid state, wherein the isolation valve is configured to maintain pressure and temperature in a remainder of the vaporization chamber while precursor material is introduced into the receptacle, wherein the remainder of the vaporization chamber and the receptacle are configured to be selectively heated to different temperatures, wherein the remainder of the vaporization chamber comprises a majority volume of the vaporization chamber and the isolatable material receptacle comprises a minority volume of the vaporization chamber, wherein the vaporization chamber further comprises one or more baffles configured to distribute the precursor material evenly as it is vaporized;
   a pyrolysis chamber configured to receive the at least one precursor material and to create reactive species from the at least one precursor material for deposition onto the plurality of at least partially assembled electronic devices and onto surfaces of a deposition chamber;
   a stop valve between the pyrolysis chamber and the vaporization chamber and a control valve between the stop valve and the pyrolysis chamber, wherein the control valve is a throttling valve;

an application station comprising the deposition chamber, the application station configured to hold the plurality of at least partially assembled electronic devices and to enable deposition of the reactive species onto the plurality of at least partially assembled electronic devices at the same time to form a moisture-resistant coating comprising a parylene coating, wherein the vaporization chamber and the pyrolysis chamber are positioned at a higher elevation than the application station, the application station including an entry door and an exit door;

a first vacuum pump coupled to the application station and a second vacuum pump associated with and dedicated for use with the vaporization chamber;

a second stop valve between the pyrolysis chamber and the application station and a second control valve between the second stop valve and the application station, wherein the second control valve is a throttling valve, wherein the valves are configured to enable uninterrupted operation of the pyrolysis chamber while at least one of the entry door and the exit door of the application station is open;

a track carried by the frame and positioned to pass through the interior of the application station through the entry door and the exit door;

a processing element programmed to receive data from one or more sensors within the apparatus and further programmed to control operation of one or more components of the apparatus based on the data received; and a rack configured to hold and transport the plurality of at least partially assembled electronic devices along the track into and through the application station while the plurality of at least partially assembled electronic devices are disposed on the rack and from the application station.

18. The apparatus of claim 17, further comprising:

a valve system associated with the application station for at least partially controlling a flow of material into the application station.

19. The apparatus of claim 18, wherein the valve system is configured to enable continuous operation of the supply system.

20. The apparatus of claim 18, wherein the valve system is configured to maintain a temperature of the pyrolysis chamber while the supply system is open to an environment external to the apparatus.

21. The apparatus of claim 18, wherein the valve system is configured to enable uninterrupted operation of at least the pyrolysis chamber while the application station is open to an environment external to the apparatus.

* * * * *